US008202790B2

(12) United States Patent
Utsuno

(10) Patent No.: US 8,202,790 B2
(45) Date of Patent: Jun. 19, 2012

(54) SEMICONDUCTOR DEVICE AND METHOD OF MANUFACTURING THE SAME

(75) Inventor: Yukihiro Utsuno, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 289 days.

(21) Appl. No.: 12/012,849

(22) Filed: Feb. 5, 2008

(65) Prior Publication Data

US 2008/0185628 A1    Aug. 7, 2008

(30) Foreign Application Priority Data

Feb. 5, 2007 (JP) .................... 2007-025335

(51) Int. Cl.
*H01L 21/336* (2006.01)
*H01L 21/425* (2006.01)
(52) U.S. Cl. ...................... 438/524; 438/259
(58) Field of Classification Search ........... 257/E21.423, 257/287, 259, 264; 438/259, 257, 524
See application file for complete search history.

(56) References Cited

U.S. PATENT DOCUMENTS

| | | | | |
|---|---|---|---|---|
| 4,969,022 A * | 11/1990 | Nishimoto et al. ........... | 257/301 |
| 6,011,725 A | 1/2000 | Eitan | |
| 6,239,465 B1 * | 5/2001 | Nakagawa ..................... | 257/331 |
| 6,518,129 B2 * | 2/2003 | Hueting et al. ............... | 438/270 |
| 6,746,936 B1 * | 6/2004 | Lee ............................... | 438/445 |
| 7,274,069 B2 | 9/2007 | Deppe et al. | |
| 2003/0006428 A1 * | 1/2003 | Palm et al. ..................... | 257/200 |
| 2005/0030780 A1 | 2/2005 | Deppe et al. | |
| 2006/0284225 A1 * | 12/2006 | Popp et al. ..................... | 257/296 |

FOREIGN PATENT DOCUMENTS

JP        2005517301        6/2005

* cited by examiner

*Primary Examiner* — Marcos D. Pizarro
*Assistant Examiner* — Sarah Salerno

(57) ABSTRACT

A semiconductor device in accordance with one embodiment of the invention can include a semiconductor substrate having a groove, a bit line, a pocket implantation region, a bottom insulating membrane, and a charge accumulation region. The bit line is formed on a side of the groove in the semiconductor substrate and acts as a source and a drain. The pocket implantation region is formed to touch (or contact) the bit line, has a similar conductivity type as the semiconductor substrate, and has a dopant concentration higher than that of the semiconductor substrate. The bottom insulating membrane is formed on and touches (or contacts) a side surface of the groove. The charge accumulation layer is formed on and touches (or contacts) a side surface of the bottom insulating membrane.

10 Claims, 8 Drawing Sheets

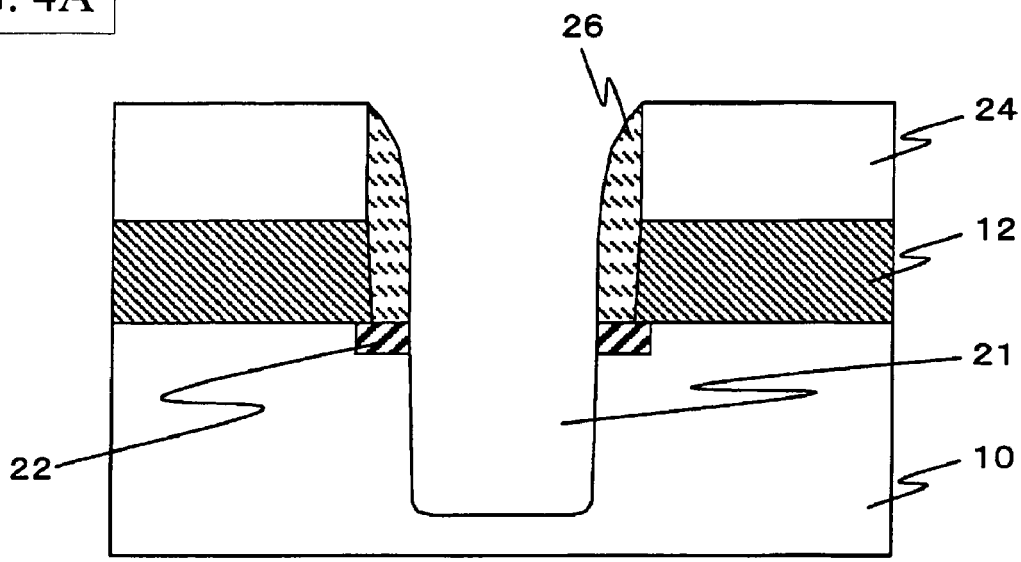
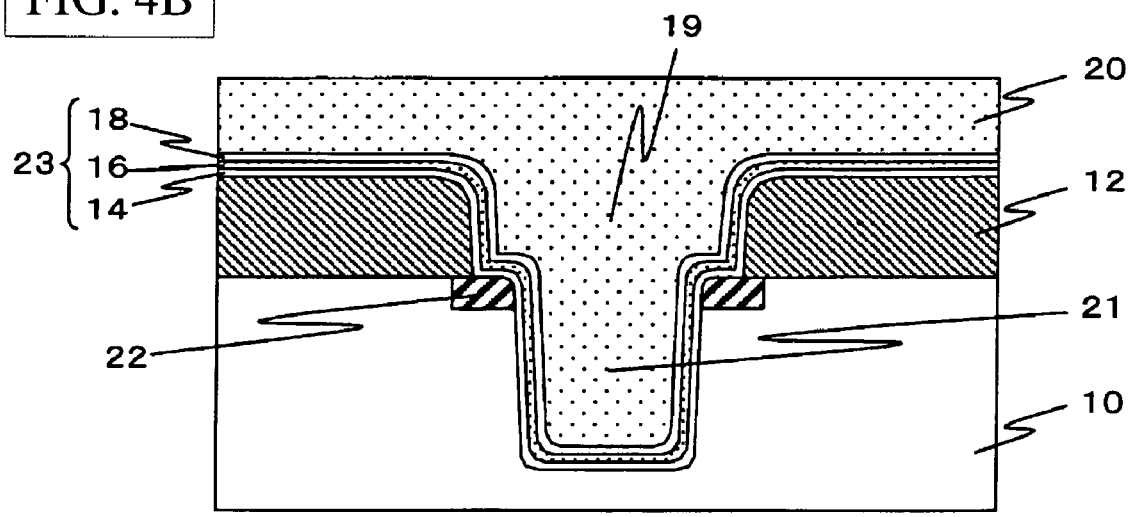

US 8,202,790 B2

SEMICONDUCTOR DEVICE AND METHOD OF MANUFACTURING THE SAME

CROSS-REFERENCE TO RELATED APPLICATIONS

This patent application claims the benefit and priority of the co-pending Japanese Patent Application No. 2007-025335, filed on Feb. 5, 2007, the entire disclosure of which is hereby incorporated by reference.

BACKGROUND

A nonvolatile memory is a semiconductor device that holds a stored data even if the semiconductor device is powered off, and is being widely used. Flash memory is one type of typical nonvolatile memories. The flash memory has a structure in which a transistor structuring a memory cell has a charge accumulation layer composed of a floating gate or an insulating membrane. A flash memory having a SONOS (Silicon Oxide Nitride Oxide Silicon) type structure is one of flash memories having the insulating layer acting as the charge accumulation layer, and stores data by accumulating a charge in a trap of a SiN (Silicon Nitride) membrane. U.S. Pat. No. 6,011,725 discloses a conventional flash memory that has a virtual ground type memory cell switching a source and a drain and operating them symmetrically as one of SONOS type of flash memories. With this structure, it is possible to form two charge accumulation regions in one charge accumulation layer of a transistor. And the memory cell is miniaturized because a bit line acts as a source and a drain and is built in a semiconductor substrate.

However, as the channel length shortens it is difficult to separate the two charge accumulation regions formed in the one charge accumulation layer, when the memory cell is miniaturized in a conventional flash memory. Japanese Patent Application Publication No. 2005-517301 discloses a conventional flash memory that solves this problem and has a miniaturized memory cell. FIG. 1 illustrates a cross sectional view of this conventional flash memory. As shown in FIG. 1, a groove 15 is formed on a semiconductor substrate 10. A bit line 12 is formed on the both sides of the groove 15 in the semiconductor substrate 10 and acts as a source and a drain. An ONO layer 23 composed of a bottom insulating membrane 14, a charge accumulation layer 16 and a top insulating membrane 18 is formed on a side surface of the groove 15. A word line 20 is formed on a side surface of the top insulating membrane 18 and acts as a gate electrode. Also, a channel length 17 is a circumference of the groove 15 as shown in FIG. 1, even if an interval between each of the bit lines is reduced. It is therefore possible to keep the channel length long and it is possible to separately form the two charge accumulation regions between the source and the drain.

However, in this conventional flash memory, a junction between the semiconductor substrate 10 acting as a P-type region and the bit line 12 acting as a N-type region is a PN junction 11 (shown in FIG. 1) where a dopant concentration changes gradually. This is because the bit line 12 is formed by implanting ions of dopant into the top surface of the semiconductor substrate 10 and the dopant concentration is low in the lower layer of the bit line 12. A data is written when an electron is implanted into the charge accumulation layer with a hot electron effect. The data is deleted when a hole is implanted into the charge accumulation layer with a hot hole effect. The electron and the hole are implanted into the charge accumulation layer near the PN junction 11 where the concentration of the dopant changes gradually. An energy of the electron and the hole is small because an electrical field is small at the PN junction 11 where the concentration changes gradually. It is therefore difficult to implant the electron and the hole into the charge accumulation layer. And there is a problem that the writing property or the deleting property of the data is degraded compared to the other conventional flash memory, described above.

As such, it is desirable to address one or more of the above issues.

SUMMARY

Various embodiments in accordance with the invention include a semiconductor device and a manufacturing method of the same that has an improved writing property of a data or an improved deleting property of a data.

According to an embodiment of the invention, a semiconductor device includes a semiconductor substrate having a groove, a bit line, a pocket implantation region, a bottom insulating membrane and a charge accumulation layer. The bit line is included on a side of the groove in the semiconductor substrate and acts as a source and a drain. The pocket implantation region can touch (or contact) the bit line, has a similar conductivity type as the semiconductor substrate, and has a dopant concentration higher than that of the semiconductor substrate. The bottom insulating membrane is formed on (or along) and touches (or contacts) a side surface of the groove. The charge accumulation layer is formed on (or along) and touches (or contacts) a side surface of the bottom insulating membrane. With this structure, a PN junction having a sharp concentration change is formed between the bit line and the pocket implantation region. It is therefore possible to improve a writing property of a data with a hot electron effect or a deleting property of a data with a hot hole effect.

The groove may have a first groove that is formed in the bit line and a second groove that has a width narrower than that of the first groove and is formed in the semiconductor substrate under the first groove. With this structure, a dopant concentration of the pocket implantation region is increased. And a PN junction having a sharp concentration change is formed between the bit line and the pocket implantation region. It is therefore possible to improve the writing property or the deleting property of a data.

The side surface of the groove may have a plane shape. With this structure, it is possible to form a groove by etching the semiconductor substrate once. And it is possible to form the groove easily.

The charge accumulation layer may be a silicon nitride membrane. With this structure, two charge accumulation regions may be formed in one charge accumulation layer.

The charge accumulation layer may be a floating gate. The semiconductor device may include a top insulating membrane covering the charge accumulation layer. And the semiconductor device may include a word line that is formed on a side surface of the top insulating membrane and acts as a gate.

According to one embodiment of the invention, a manufacturing method of a semiconductor device including steps of forming a groove on a semiconductor substrate, forming a bit line acting as a source and a drain on a side of the groove in the semiconductor substrate, forming a pocket implantation region in the semiconductor substrate so it touches (or contacts) the bit line, the pocket implantation region having a same (or similar) conductivity type as the semiconductor substrate and having a dopant concentration higher than that of the semiconductor substrate, forming a bottom insulating membrane on (or along) and touching a surface of the groove, and forming a charge accumulation layer on (or along) and touching a surface of the bottom insulating membrane. With this method, a PN junction having a sharp concentration change is formed between the bit line and the pocket implantation region. It is therefore possible to improve a writing property of a data with a hot electron effect or a deleting property of a data with a hot hole effect.

The forming of the groove may include forming a first groove by etching the bit line and forming a second groove by etching the semiconductor substrate under the first groove, the second groove having a width narrower than that of the first groove. The forming of the pocket implantation region may include forming the pocket implantation region in the semiconductor substrate under the first groove. With this method, it is possible to form the pocket implantation region directly in the semiconductor substrate under the first groove. It is therefore possible to form the pocket implantation region having a high dopant concentration with small implantation energy. Therefore, a dopant concentration distribution is reduced. And the concentration change of the PN junction between the bit line and the pocket implantation region gets sharper. It is therefore possible to improve the writing property or the deleting property of a data.

The forming of the second groove may include forming the second groove by etching the semiconductor substrate under the first groove with use of a first sidewall layer, the second groove having the width narrower than that of the first groove, and the first sidewall layer being formed on a side surface of a mask layer used during the formation of the first groove and on a side surface of the first groove. With this method, it is possible to easily fit the first groove and the second groove accurately. And it is possible to form a miniaturized groove.

The manufacturing method may include forming the pocket implantation region after forming the first groove and before forming the second groove. With this method, it is possible to easily form the pocket implantation region having a high dopant concentration with small implantation energy.

The forming the second groove may include forming the second groove by etching the semiconductor substrate under the bit line with use of a mask layer and a second sidewall layer formed on a side surface of the mask layer. And the forming of the first groove may include forming the first groove by removing the second sidewall layer and etching the bit line with use of the mask layer. With this method, it is possible to easily fit the first groove and the second groove accurately. And it is possible to miniaturize a groove.

The manufacturing method may include implanting a filing material into the second groove before forming the pocket implantation region. With this method, it is possible to form the pocket implantation region on the bottom surface of the first groove without the formation of the pocket implantation region on an inner surface of the second groove.

The forming of the groove may include forming the groove by etching the semiconductor substrate once. With this method, it is possible to form the groove more easily than a case where both of the first groove and the second groove are formed.

The forming of the pocket implantation region may include forming the pocket implantation region by implanting ions into the semiconductor substrate through the bit line with use of a mask layer. And the forming of the groove may include forming the groove having a width narrower than that of the pocket implantation region by etching the semiconductor substrate with use of a second sidewall layer formed on a side surface of the mask layer after forming the pocket implantation region. With this method, it is possible to manufacture a semiconductor device having a pocket implantation region and a groove. And it is possible to fit the position of the groove with respect to the pocket implantation region accurately.

The manufacturing method may include forming a top insulating membrane so as to cover the charge accumulation layer. The manufacturing method may include forming a word line acting as a gate on a side surface of the top insulating membrane.

BRIEF DESCRIPTION OF THE DRAWINGS

FIG. 4A and FIG. 4B illustrate a cross sectional view of the manufacturing process of the flash memory in accordance with various embodiments of the invention.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 2A:
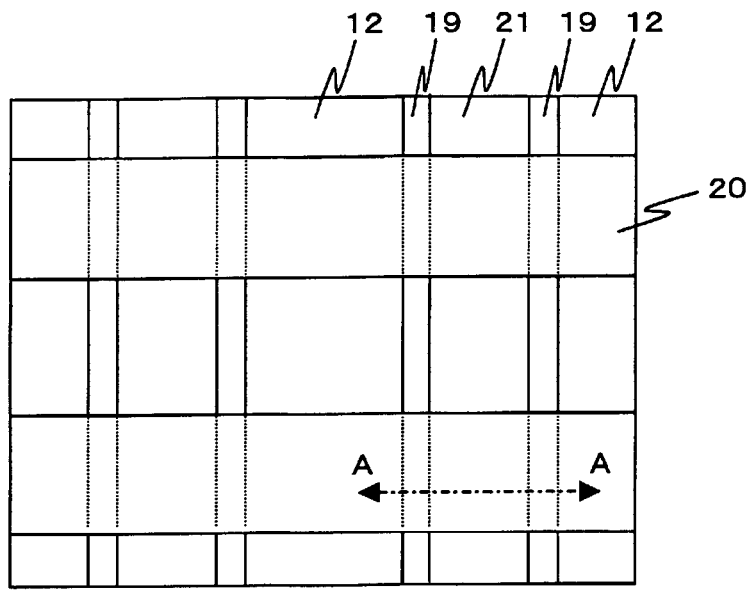
FIG. 2A illustrates a top view of a flash memory in accordance with various embodiments of the invention.
Figure 2B:
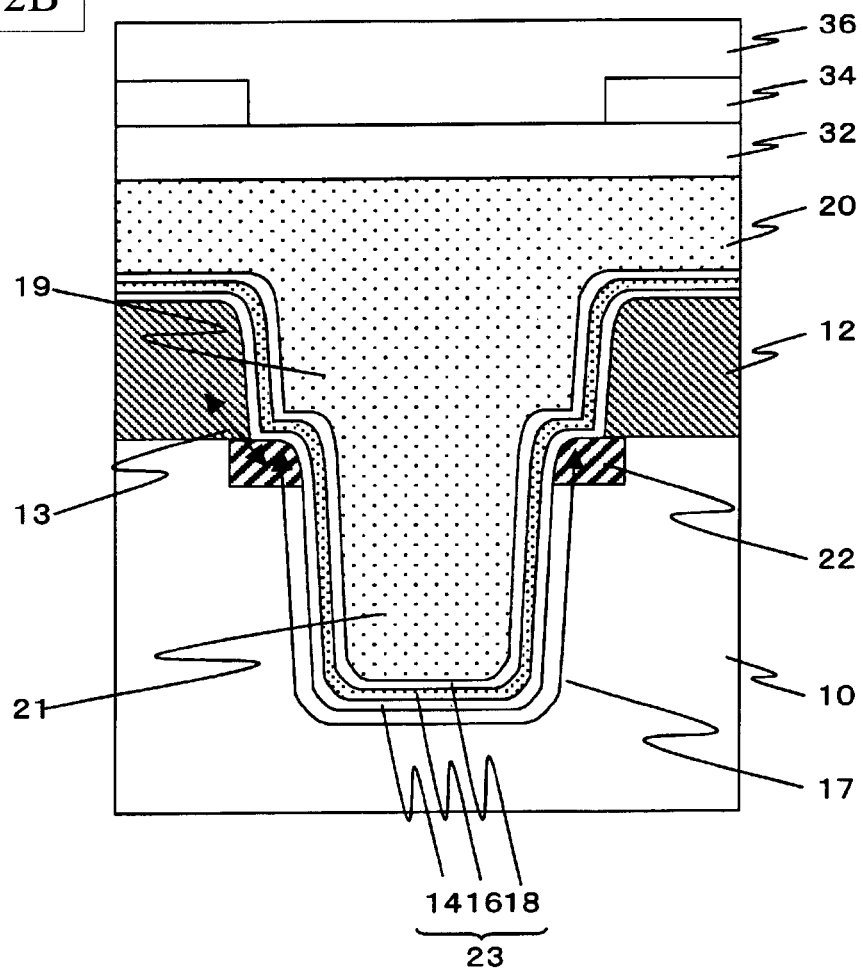
FIG. 2B illustrates a cross sectional view taken along a line A-A of FIG. 2A and an effect thereof, in accordance with an embodiment of the invention.

FIG. 2A illustrates a top view of a flash memory in accordance with various embodiments of the invention. FIG. 2B illustrates a cross sectional view taken along a line A-A of FIG. 2A and an effect thereof, in accordance with an embodiment of the invention. It is noted that FIG. 2A does not show an interlayer insulating membrane 32, a wiring layer 34, a protective membrane 36, a pocket implantation region 22 and the ONO layer 23 that are shown in FIG. 2B. As shown in FIG. 2A, the bit line 12 and the word line 20 are arranged in a lattice pattern. The bit line 12 can be composed of a N-type diffusion layer and acts as a source and a drain. The word line 20 is composed of polysilicon and acts as a gate. A first groove 19 and a second groove 21 are formed between each of the bit lines 12.

As shown in FIG. 2B, the first groove 19 and the second groove 21 are formed in the semiconductor substrate 10 acting as a P-type silicon substrate (or a semiconductor substrate including a P-type region). The second groove 21 is formed under the first groove 19 and has a width smaller than that of the first groove 19. The bit line 12 is formed on both sides of the first groove 19. The pocket implantation region 22 has the same (or similar) conductivity type as the semiconductor substrate 10, is a P-type diffusion layer having a dopant concentration higher than that of the semiconductor substrate 10, and can be arranged to touch (or contact) the bottom surface of the first groove 19 and the bit line 12. The ONO layer 23 can be formed on (or along) the side surface and the bottom surface of the first groove 19 and the second groove 21 and on (or along) the upper surface of the bit line 12, and is composed of the bottom insulating membrane 14 made of silicon oxide membrane or the like, the charge accumulation layer 16 made of a silicon nitride membrane or the like, and the top insulating membrane 18 made of a silicon oxide membrane or the like. The word line 20 can touch (or contact) the top insulating membrane 18. The interlayer insulating membrane 32 made of a silicon oxide membrane or the like is formed (or deposited) on the word line 20. The wiring layer 34 is made of such as aluminum or copper, and is formed (or deposited) on the interlayer insulating membrane 32 above the bit line 12. The protective membrane 36 is made of a silicon oxide membrane or the like and covers the wiring layer 34.

Figure 3A:
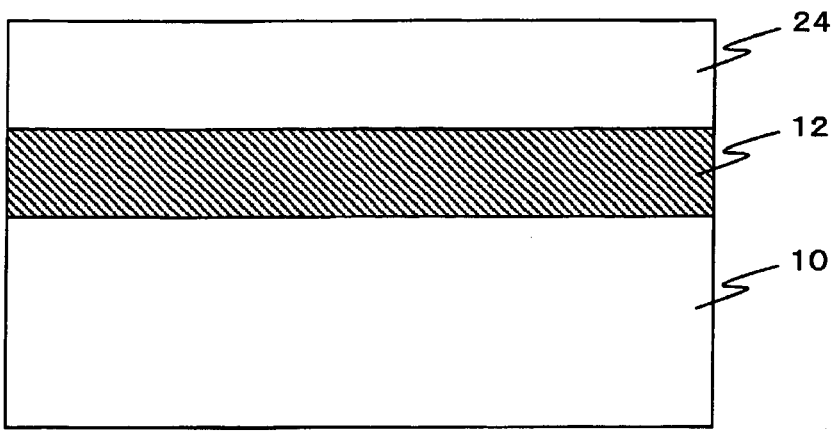
FIG. 3A through FIG. 3C illustrate a cross sectional view of a manufacturing process of the flash memory in accordance with various embodiments of the invention.

A description will be given of a manufacturing method of the flash memory in accordance with various embodiments of the invention, with reference to FIG. 3A through FIG. 4B. As shown in FIG. 3A, for example, arsenic ions are implanted into the upper portion of the semiconductor substrate 10 that is a P-type silicon substrate (or a semiconductor substrate including a P-type region), with a dose amount of $1 \times 10^{15}$ ions/cm$^2$ and with an implantation energy of approximately 10 keV to 30 keV, and the semiconductor substrate 10 is subjected to a thermal treatment. This results in the formation of the bit line 12 acting as a N-type diffusion layer. A mask layer 24 made of a silicon nitride membrane or the like is formed on the bit line 12. The silicon nitride membrane is formed with a CVD method or the like.

Figure 3B:
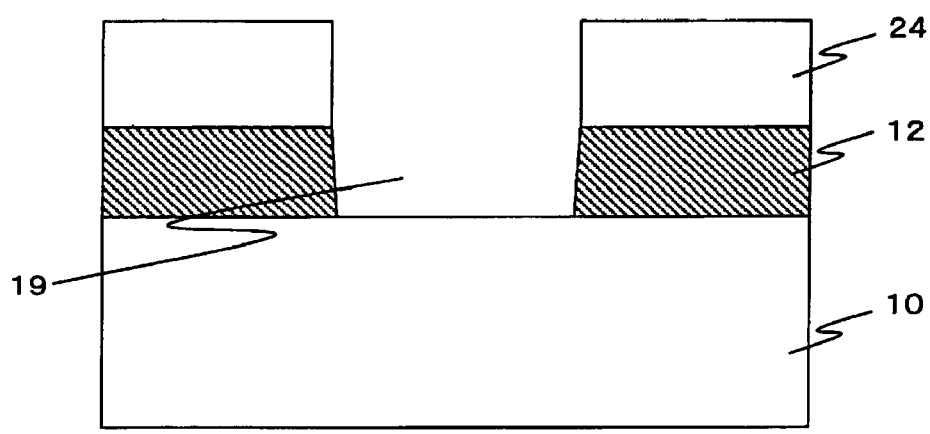
Figure 3C:
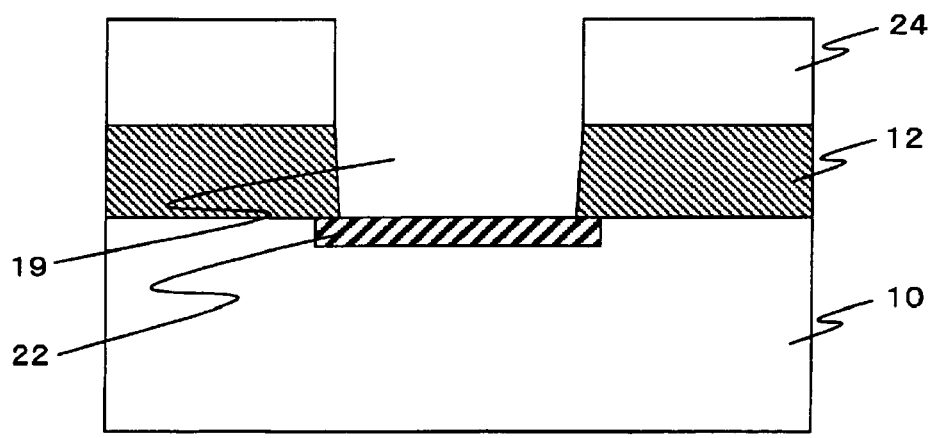

As shown in FIG. 3B, the mask layer 24 and the bit line 12 are subjected to an etching treatment using a photoresist with a RIE (reactive ion etching) method. For example in one embodiment, this results in a formation of the first groove 19 having a depth of approximately 50 nm (nanometer) and a width of approximately 150 nm in the bit line 12. As shown in FIG. 3C, boron ions are implanted into the bottom surface of the first groove 19 with use of the mask layer 24, with a dose amount of $8 \times 10^{13}$ ions/cm$^2$ and with implantation energy of approximately 5 keV to 10 keV. This results in a formation of the pocket implantation region 22 in the semiconductor substrate 10, the pocket implantation region 22 being a P-type diffusion layer having a dopant concentration higher than that of the semiconductor substrate 10.

As shown in FIG. 4A, a first sidewall layer 26 made of a silicon oxide membrane or the like is formed on the side surface of the mask layer 24 and the bit line 12. The first sidewall layer 26 can be formed when a silicon oxide membrane formed with the CVD method is subjected to an etching treatment with the RIE method. The semiconductor substrate 10 is subjected to an etching treatment with the RIE method using the mask layer 24 and the first sidewall layer 26 as a mask. For example in one embodiment, this results in a formation of the second groove 21 having a depth of approximately 100 nm and having a width of approximately 100 nm in the semiconductor substrate 10.

As shown in FIG. 4B, the mask layer 24 and the first sidewall layer 26 are removed. And the bottom insulating membrane 14 made of a silicon oxide membrane or the like is formed on the side surface and the bottom surface of the first groove 19 and the second groove 21 and on the upper surface of the bit line 12. The charge accumulation layer 16 is formed to touch (or contact) the bottom insulating membrane 14 made of a silicon nitride membrane or the like. The top insulating membrane 18 made of a silicon oxide membrane or the like is formed to touch (or contact) the charge accumulation layer 16. The silicon oxide membrane of the bottom insulating membrane 14 and the top insulating membrane 18 is formed with the CVD method, a thermally-oxidized membrane method, or the like. The silicon nitride membrane of the charge accumulation layer 16 is formed with the CVD method, or the like. These results in a formation of the ONO layer 23 composed of the bottom insulating membrane 14, the charge accumulation layer 16 and the top insulating membrane 18. The word line 20 can act as a gate made of polysilicon or the like is formed to touch (or contact) the top insulating membrane 18. Further, the interlayer insulating membrane 32, the wiring layer 34 and the protective membrane 36 are formed. In this manner, the flash memory of FIG. 2B can be manufactured in accordance with various embodiments of the invention.

Figure 1:
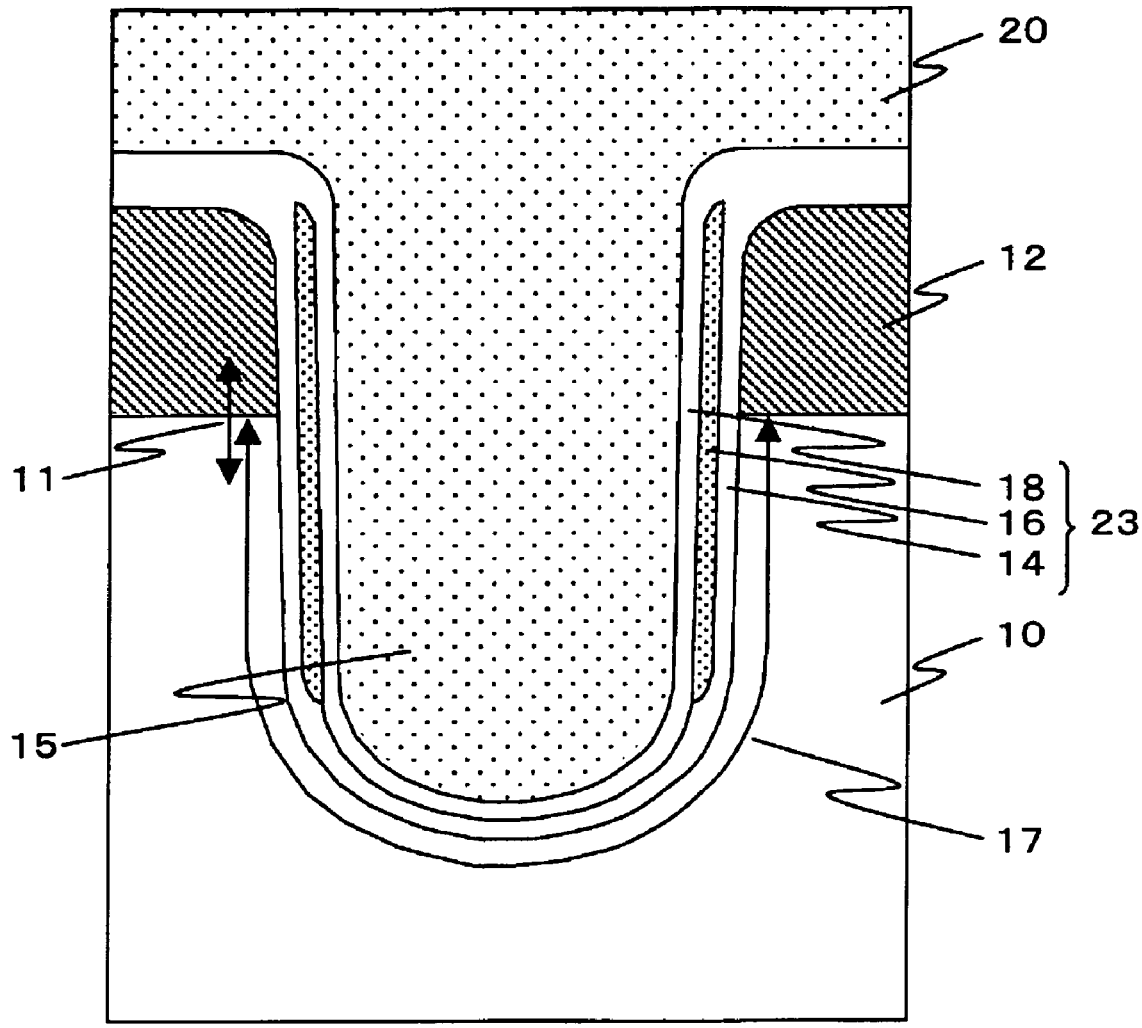
FIG. 1 illustrates a cross sectional view of a conventional flash memory.

A description will be given of an effect of the flash memory manufactured in accordance with various embodiments of the invention, with reference to FIG. 2B. It is noted that conventionally in a flash memory having a groove structure transistor as shown in FIG. 1, an electrical field is small between the source and the drain because the PN junction has a gradual concentration change. That is, it is difficult to implant the electron into the charge accumulation layer with the hot electron effect because the energy of the electron is small, and it is difficult to implant the hole into the charge accumulation layer with the hot hole effect. This problem is a reason why the writing property or the deleting property of a data is degraded. Therefore, within one embodiment in accordance with the invention, the bit line 12 that is a N-type diffusion layer touches (or contacts) the pocket implantation region 22 that is a P-type diffusion layer (or a semiconductor substrate including a P-type region) having a dopant concentration higher than that of the semiconductor substrate 10. This results in a formation of a PN junction 13 where the dopant concentration changes sharply. The electron has larger energy compared to that of FIG. 1 because a larger electrical field is applied between the source and the drain. Therefore, the electron may be easily implanted into the charge accumulation layer 16 with the hot electron effect. And the hole may be easily implanted into the charge accumulation layer 16 with the hot hole effect. It is therefore possible to improve the writing property or the deleting property of the data.

Note that in one embodiment, it is possible to implant the boron ions directly into the bottom surface of the first groove 19 as shown in FIG. 3C. It is therefore possible to form the pocket implantation region 22 as a P-type diffusion layer having a high dopant concentration with the implantation energy smaller than that associated with FIGS. 7A and 7B, described later. It is therefore possible to reduce a dopant concentration distribution in a depth direction, compared to that associated with FIGS. 7A and 7B. And the concentration change at the PN junction 13 is sharper than that associated with FIGS. 7A and 7B, the PN junction 13 being between the bit line 12 of the N-type diffusion layer and the pocket implantation region 22 of the P-type diffusion layer having a high dopant concentration. It is therefore possible to improve the writing property or the deleting property of the data.

Figure 5A:
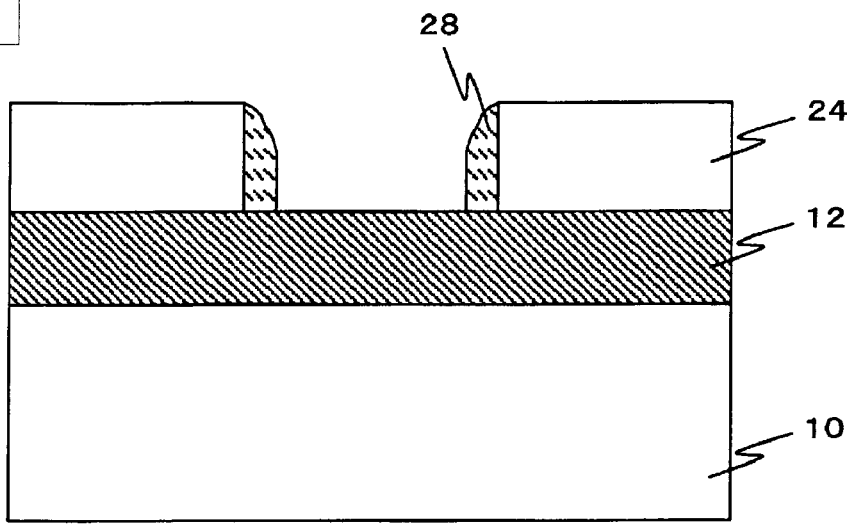
FIG. 5A through FIG. 5C illustrate a cross sectional view of a manufacturing process of the flash memory in accordance with various embodiments of the invention.
Figure 5B:
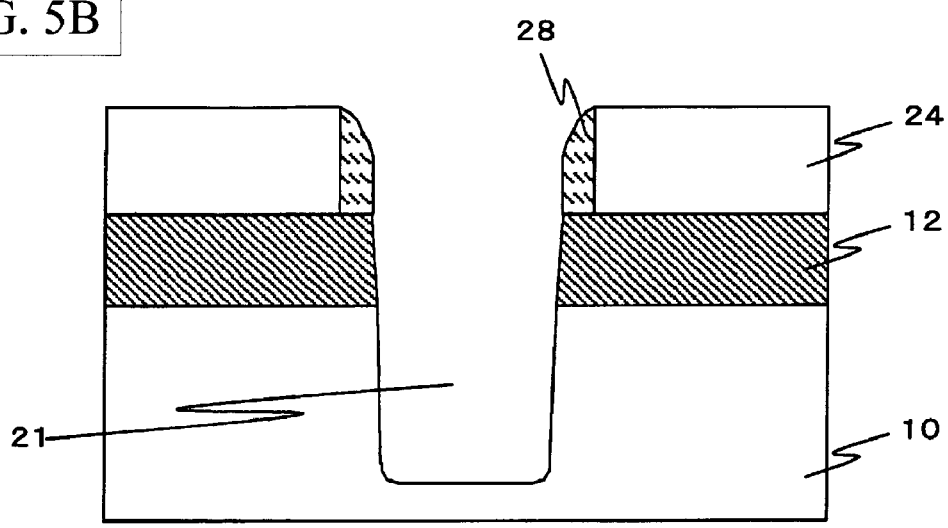
Figure 5C:
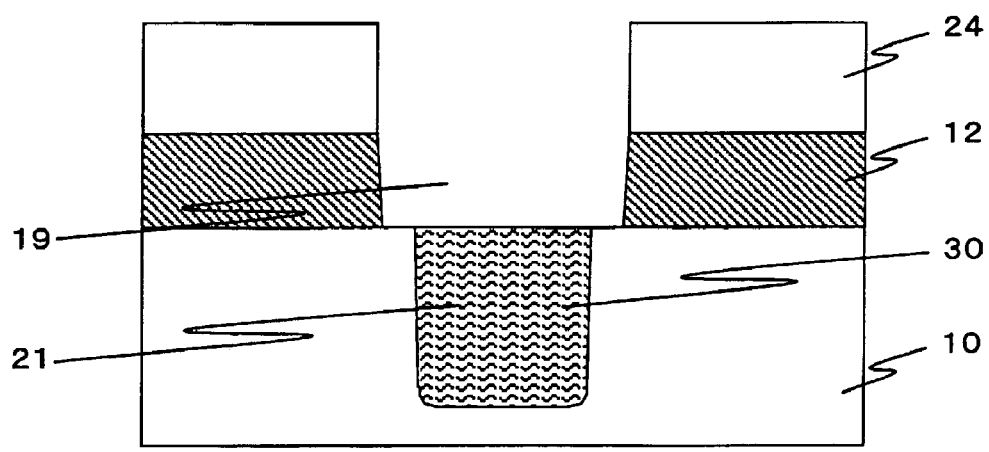
Figure 6:
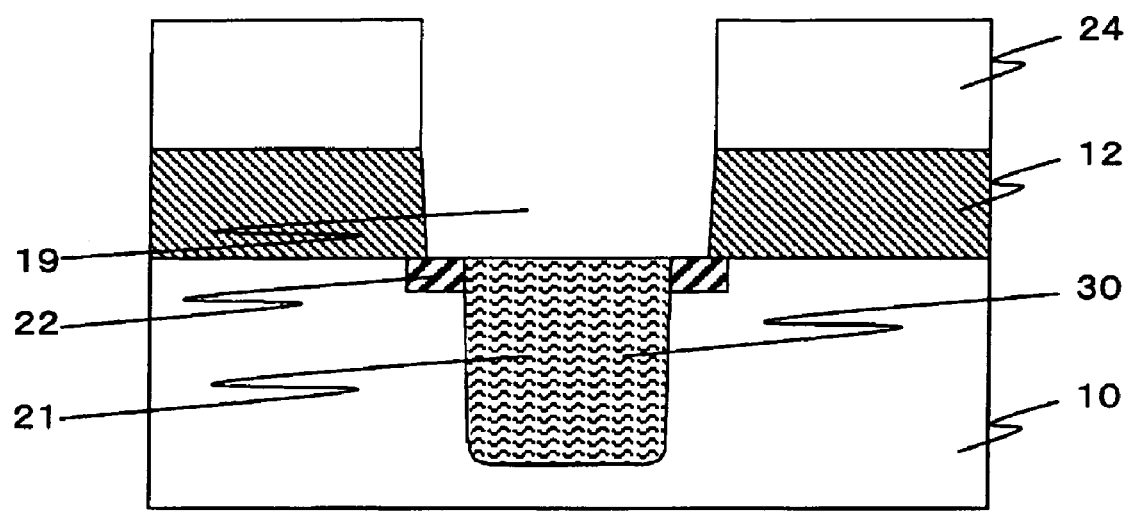
FIG. 6 illustrates a cross sectional view of the manufacturing process of the flash memory in accordance with various embodiments of the invention.

It is noted that the embodiments described thus far do not involve forming a filling material (e.g., 30) within the second groove 21, as shown in FIGS. 5C and 6. It is therefore possible to manufacture the flash memory of FIGS. 2A through 4B more easily than that of FIGS. 5A and 6. It is further possible to fit the first groove 19 and the second groove 21 accurately and it is possible to reduce the width of the first groove 19 and the second groove 21 compared to a case where a resist is used, because the etching is treated after the first sidewall layer 26 is formed in the case where the second groove 21 is formed as shown in FIG. 4A.

A description will be given of a manufacturing method of a flash memory in accordance with various embodiments of the invention, with reference to FIG. 5A through FIG. 6. A forming method of the bit line 12 and the mask layer 24 can be the same as that shown in FIG. 3A. As shown in FIG. 5A, the mask layer 24 is subjected to an etching treatment with the RIE method using a photoresist. A second sidewall layer 28 made of a silicon oxide membrane or the like is formed on the side surface of the etched mask layer 24. It is noted that the forming method of the second sidewall layer 28 can be similar to that of the first sidewall layer 26 of FIG. 4A. As shown in FIG. 5B, the semiconductor substrate 10 is subjected to an etching treatment with the RIE method using the mask layer 24 and the second sidewall layer 28 as a mask. For example in one embodiment, this results in a formation of the second groove 21 having a depth of approximately 100 nm and a width of approximately 100 nm in the semiconductor substrate 10.

As shown in FIG. 5C, a filling material 30 is implanted in the second groove 21. Here, the filling material 30 is a material for filling the second groove 21, and may be removed easily as well as a resist or the like. The second sidewall layer 28 is removed. The bit line 12 is subjected to an etching treatment with the RIE method using the mask layer 24. For example in one embodiment, this results in a formation of the first groove 19 having a depth of approximately 50 nm and a width of approximately 150 nm.

As shown in FIG. 6, for example in one embodiment, boron ions are implanted into the bottom surface of the first groove 19 with use of the mask layer 24, with a dose amount of $8 \times 10^{13}$ ions/cm$^2$ and with implantation energy of approximately 5 keV to 10 keV. This results in a formation of the pocket implantation region 22 that is a P-type diffusion layer having a high dopant concentration. After that, the filling material 30 implanted in the second groove 21 is removed. It is noted that the ONO layer 23, the word line 20, the interlayer insulating membrane 32, the wiring layer 34 and the protective membrane 36 can then be formed as shown in FIG. 4B. In this manner, a flash memory in accordance with an embodiment of the invention can be manufactured.

It is noted that the flash memory in accordance with FIG. 5A through FIG. 6 can have the same effect as the flash memory in accordance with the embodiment shown in FIG. 2B.

Note that it is possible to implant the boron ions directly into the bottom surface of the first groove 19 as shown in FIG. 6. It is therefore possible to form the pocket implantation region 22 being a P-type diffusion layer having a high dopant concentration with the implantation energy smaller than that associated with FIGS. 7A and 7B, described later. It is therefore possible to improve the writing property or the deleting property of the data, because the PN junction 13 having a sharper concentration change is formed. Further, it is possible to form the pocket implantation region 22 on the bottom surface of the first groove 19 without the formation of the pocket implantation region 22 in the inner surface of the second groove 21, because the filling material 30 is implanted in the second groove 21. And the filling material 30 does not burden the manufacturing of the flash memory because the filling material 30 can be removed easily.

The second groove 21 is formed with use of the second sidewall layer 28 as shown in FIG. 5B, before forming the first groove 19 by removing the second sidewall layer 28 as shown in FIG. 5C. It is therefore possible to fit the first groove 19 and the second groove 21 accurately. And it is possible to reduce the width of the first groove 19 and the second groove 21 compared to a case where a resist is used.

In the manufacturing method of the flash memory in accordance FIGS. 5A through 6, the second groove 21, the first groove 19 and the pocket implantation region 22 are formed in that order. However, it is possible to obtain the same effect as the FIG. 6, even if the first groove 19, the second groove 21 and the pocket implantation region 22 are formed in that order.

In accordance with FIGS. 3A through 4B and FIGS. 5A through 6, the first groove 19 and the second groove 21 are formed so that the pocket implantation region 22 is a P-type diffusion layer having a high dopant concentration that is formed with small implantation energy. It is therefore possible to change the depth of the first groove 19 if the pocket implantation region 22 is a P-type diffusion layer having a high dopant concentration is formed with small implantation energy.

It is noted that a top view and a cross sectional view of a flash memory in accordance with FIGS. 5A through 6 can be the same as those shown in FIG. 2A and FIG. 2B.

Figure 7A:
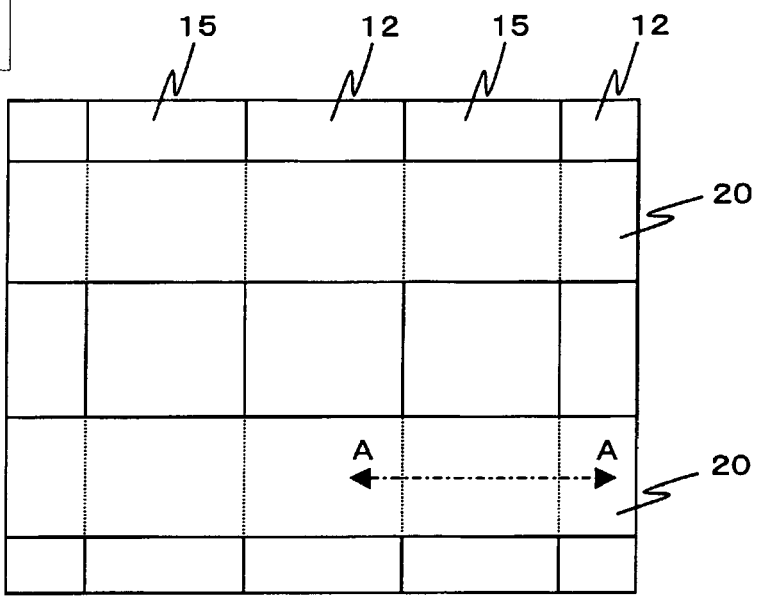
FIG. 7A illustrates a top view of a flash memory in accordance with various embodiments of the invention.
Figure 7B:
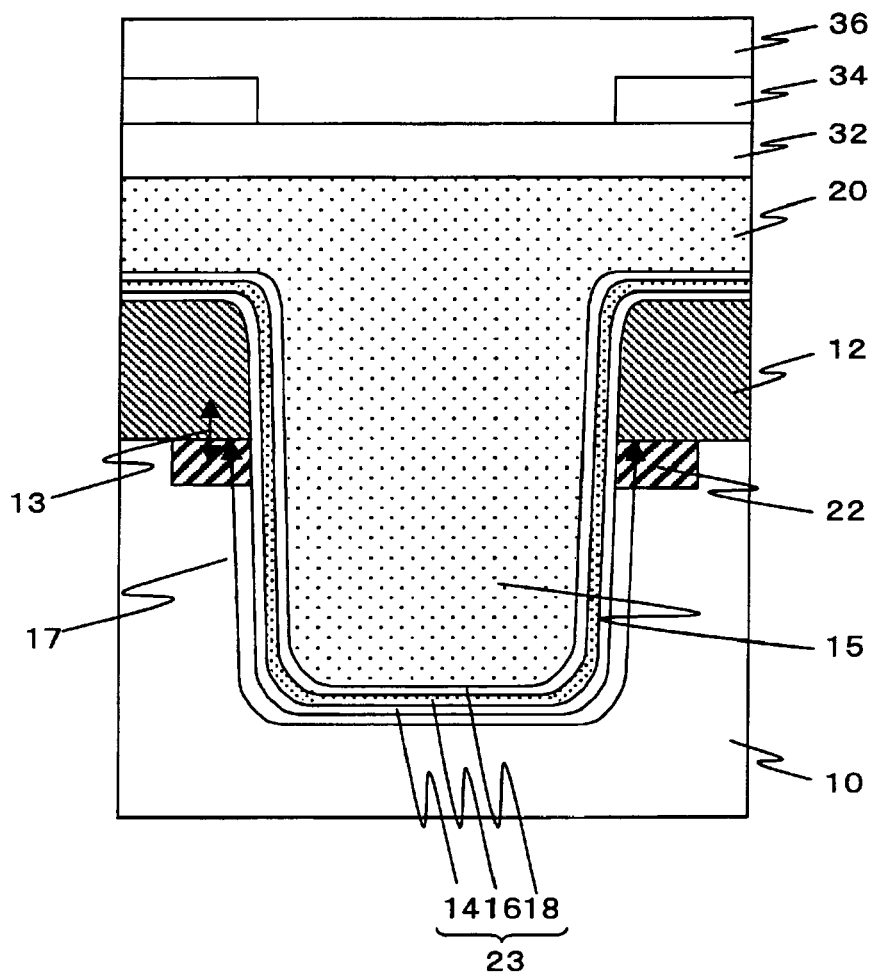
FIG. 7B illustrates a cross sectional view taken along a line A-A of FIG. 7A and an effect thereof, in accordance with an embodiment of the invention.

FIG. 7A illustrates a top view of a flash memory in accordance with various embodiments of the invention. FIG. 7B illustrates a cross sectional view taken along a line A-A of FIG. 7A and an effect thereof, in accordance with an embodiment of the invention. It is noted that FIG. 7A does not show the interlayer insulating membrane 32, the wiring layer 34, the protective membrane 36, the pocket implantation region 22 and the ONO layer 23 that is shown in FIG. 7B. As shown in FIG. 7A, the bit line 12 and the word line 20 are arranged in a lattice pattern. The bit line 12 is composed of a N-type diffusion layer and acts as a source and a drain. The word line 20 is composed of polysilicon and acts as a gate. The groove 15 can be formed between each of the bit lines 12.

As shown in FIG. 7B, the groove 15 is formed on the semiconductor substrate 10 that is a P-type silicon substrate (or a semiconductor substrate including a P-type region). A side surface of the groove 15 has a plane shape. That is, one groove is formed on the semiconductor substrate 10. The bit line 12 is formed on both sides of the groove 15. The pocket implantation region 22 has the same (or similar) conductivity type as the semiconductor substrate 10, is a P-type diffusion layer having a dopant concentration higher than that of the semiconductor substrate 10, and is arranged to touch (or contact) the bottom surface of the groove 15 and the bit line 12. The ONO layer 23 is formed on the side surface and the bottom surface of the groove 15 and on the upper surface of the bit line 12, and is composed of the bottom insulating membrane 14, the charge accumulation layer 16, and the top insulating membrane 18. The word line 20 is formed to touch (or contact) the top insulating membrane 18. The interlayer insulating membrane 32 is formed on the word line 20. The wiring layer 34 is formed on the interlayer insulating membrane 32 above the bit line 12. The protective membrane 36 covers the wiring layer 34.

Figure 8A:
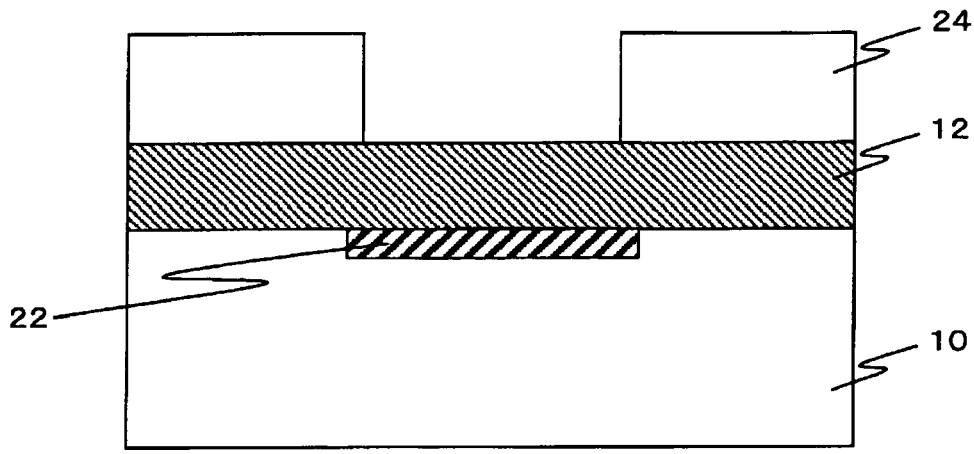
FIG. 8A through FIG. 8C illustrate a cross sectional view of the flash memory in accordance with various embodiments of the invention.

A description will be given of a manufacturing method of the flash memory in accordance with various embodiments of the invention, with reference to FIG. 8A through FIG. 8C. It is noted that the forming method of the bit line 12 and the mask layer 24 can be the same as that shown in FIG. 3A. As shown in FIG. 8A, the mask layer 24 is subjected to an etching treatment using a photoresist with the RIE method. For example in one embodiment, boron ions are implanted into the semiconductor substrate 10 through the bit line 12 with use of the mask layer 24, with a dose amount of $8 \times 10^{13}$ ions/cm$^2$ and with implantation energy of approximately 10 keV to 15 keV. This results in a formation of the pocket implantation region 22 in the semiconductor substrate 10, the pocket implantation region 22 being a P-type diffusion layer having a dopant concentration higher than that of the semiconductor substrate 10.

Figure 8B:
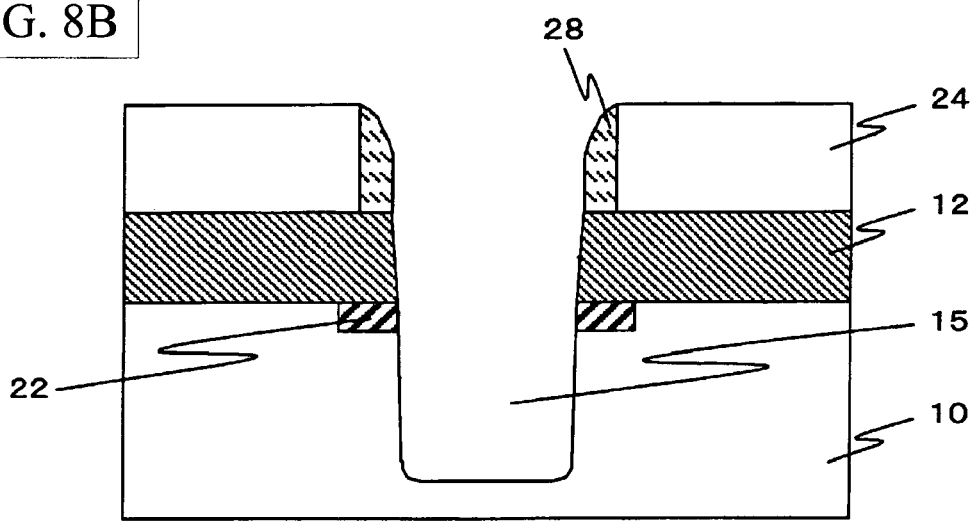

As shown in FIG. 8B, the second sidewall layer 28 made of a silicon oxide membrane or the like is formed on the side surface of the mask layer 24. The semiconductor substrate 10 is subjected to an etching treatment with the RIE method using the mask layer 24 and the second sidewall layer 28 as a mask. For example in one embodiment, this results in a formation of the groove 15 having a depth of approximately 150 nm and having a width of approximately 100 nm in the semiconductor substrate 10.

Figure 8C:
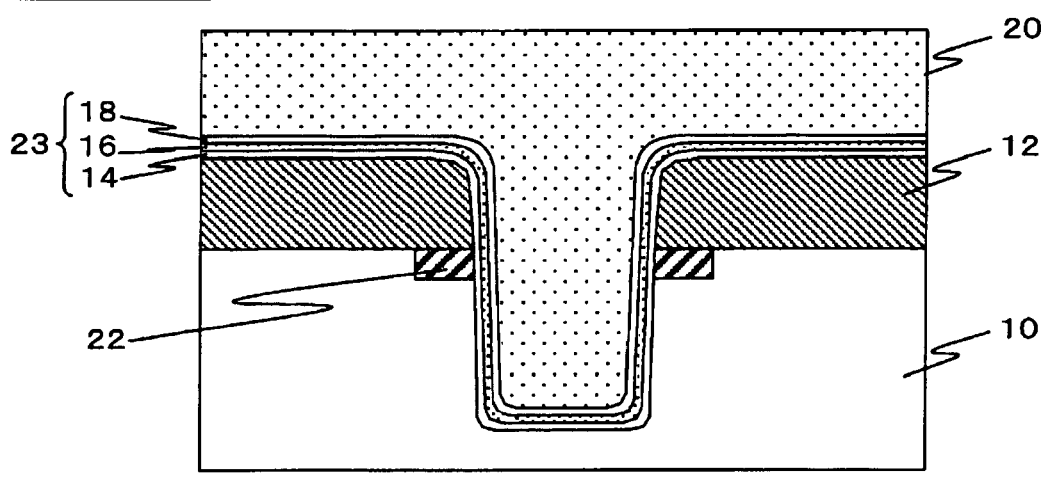

As shown in FIG. 8C, the mask layer 24 and the second sidewall layer 28 are removed. And the ONO layer 23 composed of the bottom insulating membrane 14, the charge accumulation layer 16, and the top insulating membrane 18, is formed on the side surface and the bottom surface of the groove 15 and on the upper surface of the bit line 12. The forming method of the ONO layer 23 can be the same as that shown in FIG. 4B. The word line 20 acting as a gate is formed to touch (or contact) the top insulating membrane 18. Further, the interlayer insulating membrane 32, the wiring layer 34 and the protective membrane 36 are formed. In this manner, the flash memory of FIG. 7B can be manufactured in accordance with various embodiments of the invention.

A description will be given of an effect of the flash memory manufactured in accordance with various embodiments of the invention, with reference to FIG. 7B. The PN junction 13 having a sharp concentration change is formed because the bit line 12 that is an N-type diffusion layer touches (or contacts) the pocket implantation region 22 that is a P-type diffusion layer having a high dopant concentration. The electron has larger energy compared to the conventional technique of FIG. 1 because a larger electrical field is applied between the source and the drain. Therefore, the electron may be easily implanted into the charge accumulation layer 16 with the hot electron effect. And the hole may be easily implanted into the charge accumulation layer 16 with the hot hole effect. It is therefore possible to improve the writing property or the deleting property of the data.

In the manufacturing method of the flash memory in accordance with FIG. 8A through FIG. 8C, the groove 15 can be formed with one etching treatment as shown in FIG. 8B. It is therefore possible to manufacture the flash memory more easily because two etching treatments are performed in accordance with FIG. 3A through FIG. 4B and FIG. 5A through FIG. 6.

Within FIG. 8B, it is possible to fit the pocket implantation region 22 and the groove 15 accurately because the groove 15 is formed with use of the second sidewall layer 28. And it is possible to reduce the width of the groove 15 compared to a case where the groove 15 is formed with a resist.

It is pointed out that although the flash memories have the charge accumulation layer 16 made of a silicon nitride membrane as described herein with reference to various embodiments in accordance with the invention, it is possible to obtain the same effect where the charge accumulation layer 16 is a floating gate or another insulating membrane.

It is possible to obtain the same effect as the various embodiments described herein even if the charge accumulation layer is just formed on the side surface of the groove, as shown in the conventional FIG. 1, although the charge accumulation layer 16 is formed on the side surface and the bottom surface of the first groove 19 and the second groove 21 or on the side surface of the groove 15 and on the upper surface of the bit line 12.

It is noted that the mask layer 24 can be made of a silicon nitride membrane, and the first sidewall layer 26 and the second sidewall layer 28 can be made of a silicon oxide membrane, as described herein, but are not limited to such. For example in one embodiment, the mask layer 24 can be implemented such that it has a sufficient selectivity for etching the semiconductor substrate 10 and acts as a mask when ions are implanted into the semiconductor substrate 10. In one embodiment, the first sidewall layer 26 and the second sidewall layer 28 can be implemented such that they can be removed while the mask layer 24 remains.

In various embodiments, it is noted that the word line 20 touches (or contacts) the top insulating membrane 18, but is not limited to such. For example in one embodiment, it is possible to obtain the same effect as the various embodiment described herein even if the word line 20 is implemented to touch (or contact) the charge accumulation layer 16, without the top insulating membrane 18.

In various embodiment described herein, the bit line 12 can be formed as an N-type diffusion layer and the pocket implantation region 22 can be formed having a high dopant concentration and being a P-type diffusion layer, but are not limited to such. It is noted that the bit line 12 and the pocket implantation region 22 can each be formed (or implemented) in a wide variety of ways.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A method of manufacturing a semiconductor device comprising:
    forming a first groove in a semiconductor substrate, wherein a side surface of the first groove comprises a bit line;
    forming a pocket implantation region in a bottom surface of the first groove and in the semiconductor substrate that touches the bit line, the pocket implantation region having a similar conductivity type as the semiconductor substrate and having a dopant concentration higher than that of the semiconductor substrate;
    forming a second groove in the bottom surface of the first groove that extends beyond the pocket implantation region in the semiconductor substrate, the second groove having a width narrower than that of the first groove;

forming a bottom insulating membrane on and touching a side surface of the first groove and a side surface of the second groove; and forming a charge accumulation layer on and touching a side surface of the bottom insulating membrane.

2. The method of claim 1, wherein
the forming of the first groove comprises etching the bit line.

3. The method of claim 2, wherein:
the forming of the second groove comprises forming the second groove by etching the semiconductor substrate under the bit line with use of a mask layer and a second sidewall layer formed on a side surface of the mask layer; and
the forming of the first groove comprises forming the first groove by removing the second sidewall layer and etching the bit line with use of the mask layer.

4. The method of claim 2 further comprising implanting a filling material into the second groove before forming the pocket implantation region.

5. The method of claim 1, wherein the forming of the second groove comprises etching the semiconductor substrate under the first groove with use of a first sidewall layer, the first sidewall layer being formed on a side surface of a mask layer used during the formation of the first groove and on a side surface of the first groove.

6. The method of claim 1, wherein the bottom insulating membrane extends below the pocket implantation region.

7. The method of claim 1, wherein a side surface of the second groove comprises a portion of the pocket implantation region.

8. The method of claim 7, wherein:
the forming of the pocket implantation region comprises forming the pocket implantation region by implanting ions into the semiconductor substrate through the bit line with use of a mask layer; and
the forming of the groove comprises forming the groove having a width narrower than that of the pocket implantation region by etching the semiconductor substrate with use of a second sidewall layer formed on a side surface of the mask layer after the forming of the pocket implantation region.

9. The method of claim 1 further comprising forming a top insulating membrane so as to cover the charge accumulation layer.

10. The method of claim 9 further comprising forming a word line acting as a gate on a side surface of the top insulating membrane.

* * * * *